(12) United States Patent
Chen et al.

(10) Patent No.: US 7,759,238 B2
(45) Date of Patent: Jul. 20, 2010

(54) METHOD FOR FABRICATING SEMICONDUCTOR DEVICE CAPABLE OF ADJUSTING THE THICKNESS OF GATE OXIDE LAYER

(75) Inventors: Tai Chiang Chen, Shanghai (CN); Xin Wang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/187,370

(22) Filed: Aug. 6, 2008

(65) Prior Publication Data

US 2009/0042379 A1 Feb. 12, 2009

(30) Foreign Application Priority Data

Aug. 9, 2007 (CN) .................. 2007 1 0044802

(51) Int. Cl.
*H01L 21/3205* (2006.01)
*H01L 21/4763* (2006.01)
(52) U.S. Cl. .................. 438/591; 438/197; 438/981; 257/638; 257/E21.625; 257/E21.639; 257/E21.675
(58) Field of Classification Search .................. 438/591, 438/197, 981; 257/638, E21.625, E21.639, 257/E21.675
See application file for complete search history.

(56) References Cited

U.S. PATENT DOCUMENTS

| 6,221,698 | B1 | 4/2001 | Shiau |
| 6,613,677 | B1 * | 9/2003 | Herbots et al. .............. 438/694 |
| 7,241,700 | B1 * | 7/2007 | En et al. .................... 438/745 |
| 2005/0202680 | A1 * | 9/2005 | Yeh et al. .................... 438/694 |

OTHER PUBLICATIONS

Chinese Office Action of related application mailed Nov. 6, 2009, 6 pgs. without translation.

* cited by examiner

*Primary Examiner*—Davienne Monbleau
*Assistant Examiner*—Monica D Harrison
(74) *Attorney, Agent, or Firm*—Squire, Sanders & Dempsey, L.L.P.

(57) ABSTRACT

The present invention provides a method for fabricating semiconductor device, which is capable of adjusting a gate oxide layer thickness, including: providing a semiconductor substrate; growing a first oxide layer on a surface of the semiconductor substrate; patterning the first oxide layer to expose the first oxide layer corresponding to a gate to be formed; removing the exposed first oxide layer; immersing the substrate into deionized water to grow a second oxide layer; forming a polysilicon layer on the surfaces of the first oxide layer and the second oxide layer; and etching the polysilicon layer to form a gate. The method for fabricating semiconductor device according to the present invention, which is capable of adjusting the thickness of gate oxide layer, can control the thickness of gate oxide layer precisely to satisfy the requirement for different threshold voltages.

8 Claims, 8 Drawing Sheets

METHOD FOR FABRICATING SEMICONDUCTOR DEVICE CAPABLE OF ADJUSTING THE THICKNESS OF GATE OXIDE LAYER

This application claims the priority of Chinese Patent Application No. 200710044802.2, filed Aug. 9, 2007, the entire disclosure of which is incorporated herein by reference.

FIELD OF THE INVENTION

The present invention generally relates to a method for fabricating semiconductor device, and more particularly, to a method for fabricating semiconductor device, which is capable of adjusting the thickness of gate oxide layer.

DESCRIPTION OF THE RELATED ART

With the rapid development of techniques for fabricating semiconductor device, semiconductor device increasingly possesses faster operation speed, larger data-storage and more functions. Metal oxide field semiconductor effect transistor (MOSFET), referred as MOS transistor hereinafter, is one of the most widely used devices in integrated circuits. Processes for fabricating MOS transistor are highly repeatable and controllable. After processes for fabricating semiconductor device achieve sub-micron level, MOS transistor continuously decreases in volume, increases in integration level, and is widely applied to various super large-scale memory and logic integrated circuits.

MOS transistor comprises a source and a drain as well a conductive gate formed in a semiconductor substrate. The source and drain are located in the substrate at both sides of a channel region respectively, while a gate oxide layer and the gate are formed on the substrate surface over the channel. NMOS transistor or PMOS transistor may be formed by doping the substrate with different types of dopant. FIG. 1 is a schematic view showing a simplified structure of a metal oxide semiconductor field effect transistor. As shown in FIG. 1, the process for fabricating MOS transistor generally comprises the following steps: firstly growing a gate oxide layer 11 on a surface of a substrate 10, which is usually a uniform and compact oxide layer formed by a thermal oxidation process and has a controllable thickness and a low level of fixed charges; then, depositing a polysilicon layer on the surface of the gate oxide layer and forming a gate 12 by photolithography and etching, in which the polysilicon layer may have a conductivity by using an in situ doping process during the deposition process, or using a diffusion process, or performing an ion plantation process after the deposition process; usually forming a metal layer or a metal silicide layer on the polysilicon layer to lower the resistivity of the gate; and then, planting ions into the substrate at both sides of the gate to form a source 12 and a drain 13, in which the source 12, the drain 13 and the channel region are self-aligned with the gate 12.

The most important electrical characteristic parameters of MOS transistor include threshold voltage and saturation leakage current. In general, a method for reducing the saturated leakage current comprises reducing a dose of ions planted into lightly doped regions of the source and drain. It is demonstrated by studies that the upper limit of the threshold voltage of MOS transistor is largely associated with a tolerable breakdown voltage of the gate oxide layer, and this breakdown voltage is mainly depended on the thickness of the gate oxide layer. Since MOS transistors for different purposes are operated at different threshold voltages, the practically used MOS transistors would have different gate oxide layer thicknesses in order to meet the requirements of the different threshold voltages. Currently, both logic circuits and memory circuits are usually designed in the same one chip, in which the logic circuits need the MOS transistors with thinner gate oxide layer, while the storage circuits need the MOS transistors with thicker gate oxide layer. With regard to a flash memory, gate oxide layers with different thicknesses are also desired to satisfy the requirement for tunneling oxide layer. Chinese Patent No. ZL01109732.9 discloses a method for forming gate oxide layers with different thicknesses, in which the gate oxide layers with different thicknesses are formed by a thermal oxidation process. However, it is difficult for such thermal oxidation process to precisely control the thickness of gate oxide layer, when the controlled thickness becomes thinner and thinner.

SUMMARY OF THE PRESENT INVENTION

An object of the present invention is to provide a method for fabricating semiconductor device, which is capable of adjusting the thickness of gate oxide layer, so that the method can control the thickness of gate oxide layer precisely to satisfy the requirement for different threshold voltages.

In one aspect of the present invention, provided a method for fabricating semiconductor device, which is capable of adjusting the thickness of gate oxide layer, comprising:
providing a semiconductor substrate;
growing a first oxide layer on the surface of the semiconductor substrate;
patterning the first oxide layer and removing the exposed first oxide layer;
growing a second oxide layer in deionized water at the place where the first oxide layer is removed; and
depositing a polysilicon layer and etching the polysilicon layer to form a gate.

The first oxide layer is grown by employing a furnace thermal oxidation process.

The exposed first oxide layer is removed by using hydrofluoric acid.

In another aspect of the present invention, provided a method for fabricating semiconductor device, which is capable of adjusting the thickness of gate oxide layer, comprising:
providing a semiconductor substrate;
growing a first oxide layer on the surface of the semiconductor substrate;
patterning the first oxide layer and removing the exposed first oxide layer;
growing a second oxide layer in deionized water at the place where the first oxide layer is removed;
forming a third oxide layer on the surfaces of the first oxide layer and the second oxide layer;
forming a polysilicon layer on the surface of the third oxide layer; and
etching the polysilicon layer to form a gate.

The method further comprises a step of heating the deionized water.

The first oxide layer is grown by a furnace thermal oxidation process.

The first oxide layer at the place corresponding to the gate is removed by using hydrofluoric acid.

The third oxide layer is formed by using the furnace thermal oxidation process or a chemical vapor deposition process.

The embodiments of the present invention have the following advantages in comparison with the prior art.

After forming a gate oxide layer on a substrate surface, the gate oxide layer at the place corresponding to the gate is etched by photolithography and etching process, then the substrate is immersed into deionized water to grow a gate oxide layer again at the place corresponding to the gate. In deionized water, the gate oxide layer grows uniformly and its thickness can be controlled precisely, so that the thickness of the grown gate oxide layer can be controlled precisely by controlling the immersion time of the substrate in the deionized water. The newly grown gate oxide layer can be either thicker than or thinner than the gate oxide layer originally grown on the surface of the source and drain, and the input and output performances would not be influenced while the threshold voltage is adjusted, thereby meeting the requirement for a low threshold voltage device. In addition, after an oxide layer is grown in deionized water, a gate oxide layer can be grown continually on the surface of the substrate in the above embodiments, in which the gate oxide layer covers the primarily grown gate oxide layer and the oxide layer grown in deionized water, so that the overall thickness of the oxide layer further increases to satisfy the requirement for a device with high threshold voltage and low saturated leakage current. The embodiments of the present invention can handily control the thickness of gate oxide layer and adjust the threshold voltage without changing the input and output performance of MOS transistor, thereby improving the properties of the device.

BRIEF DESCRIPTION OF THE DRAWINGS

The above and other objects, features and advantages of the present invention will become more obvious by the following description of the preferred embodiments given in conjunction with the accompanying drawings. The same reference numbers will be used throughout the drawings to refer to the same or similar parts. The drawings are merely illustrative and may not be drawn to scale. In the drawings, the thicknesses of layers and regions are exaggerated for purposes of clarity only.

The drawings of the present invention are merely examples, but not intended to limit the present invention.

SPECIFIC EMBODIMENTS OF THE PRESENT INVENTION

Hereinafter, embodiments of the present invention are described in detail with reference to the drawings to further demonstrate the above objects, features and advantages of the present invention.

The following description demonstrates the present invention in detail, but the present invention is not intended to be restricted by the following examples. Those skilled in the art understand that many other embodiments may be performed without departing from the scope and sprit of the appended claims.

The methods according to the present invention adapt to both logic devices and memory devices, particularly to MOS transistor with a characteristic size of 0.18 μm or less used in logic circuits. The MOS transistor can be PMOS transistor or NMOS transistor in CMOS (complementary metal oxide semiconductor device).

The design of semiconductor integrated circuits is developing in the following tendencies: employing MOS transistors with different gate oxide thicknesses, integrating circuits on the same one chip, and using different threshold voltages to change operating characteristics. For example, a field effect transistor may also use gate oxide layers with different thicknesses to achieve an effect of high operating speed (using thinner gate oxide layers) or an effect of low leakage current (using thicker gate oxide layers). Therefore, MOS transistor in a memory module may have thicker gate oxide layers, while MOS transistor in a high speed, low voltage logic circuit may obviously have relatively thinner gate oxide layers. In an integrated circuit module, circuits with different functions need close cooperation of MOS transistors with different switch characteristics. For example, a graphic processor or a graphic accelerator may perform its core function by a circuit similar to microprocessor or digital signal processor. The processor is generally a high-speed MOS transistor logic circuit which employs high-speed MOS transistors with low threshold voltage and thin gate oxide layer.

Generally, a logic circuit with high speed and lower threshold voltage is used within a high speed microcontroller or a microprocessor, while a relatively robust I/O circuit with a higher threshold voltage may be required in a peripheral circuit around a core circuit of chip, and a fixed logic circuit with a thicker gate oxide layer and a suitable high operation voltage is required in a portion of the substrate for MOS field effect transistors. That is to say, MOS transistors at different positions of chip would have gate oxide layers with different thicknesses.

Figure 1:
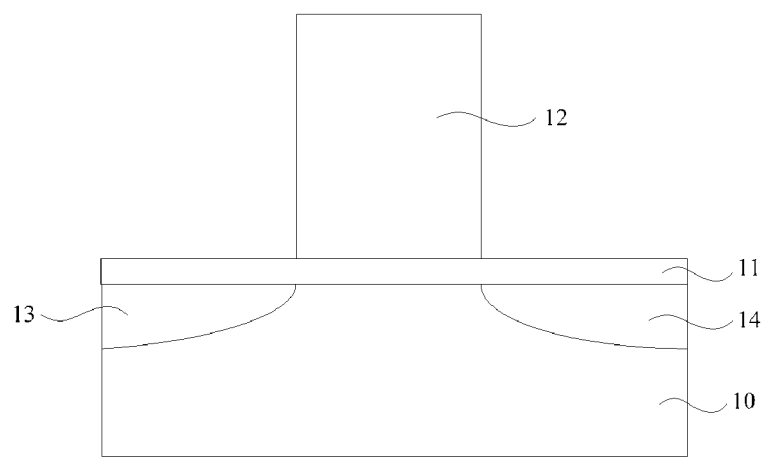
FIG. 1 is a schematic view showing a simplified structure of a metal oxide semiconductor field effect transistor.
Figure 2:
FIG. 2 to FIG. 18 are schematic views showing methods for fabricating semiconductor devices according to embodiments of the present invention.

FIG. 2 to FIG. 18 are schematic views showing methods for fabricating semiconductor devices according to embodiments of the present invention. The drawings are merely examples, but not intended to limit the present invention. As shown in FIG. 2, a gate oxide layer 110 is formed on a surface of a semiconductor substrate 100 according to an embodiment of the present invention. The substrate 100 can be made of silicon or silicon-germanium (SiGe) with a single crystal, polycrystal or amorphous structure, or can be made of a silicon-on-insulator (SOI). Alternatively, the substrate 100 can also includes other materials, such as indium antimonide, lead telluride, indium arsenide, indium phosphide, gallium arsenide, or gallium antimonide. Although some materials are described here as examples of materials for forming the substrate 100, any other materials suitable for making semiconductor substrates will fall into the spirit and scope of the present invention. The above-mentioned gate oxide layer 110 can be made of silicon oxide ($SiO_2$) or silicon oxynitride (SiNO). At the sub-65 nm process, the gate oxide layer 110 is preferably made of materials with a high dielectric constant, such as hafnium oxide, hafnium silicon oxide, hafnium silicon oxynitride, lanthanum oxide, zirconium oxide, zirconium silicon oxide, titanium oxide, tantalum oxide, barium strontium titanium oxide, barium titanium oxide, strontium titanium oxide, aluminum oxide, etc. Hafnium oxide, zirconium oxide and aluminum oxide are particularly preferred. Although a few of materials capable of forming the gate oxide layer 110 are described above, the gate oxide layer 110 may also be made of other materials which can reduce the leakage current of the gate. The growth of gate oxide layer 110 may be performed by a thermal oxidation process or any conventional vacuum deposition processes, such as atom layer deposition (ALD), chemical vapor deposition (CVD), plasma enhanced chemical vapor deposition (PECVD). The preferred process is a furnace thermal oxidation process, which may form a gate oxide layer 110 with uniform thickness and compactness.

Figure 3:
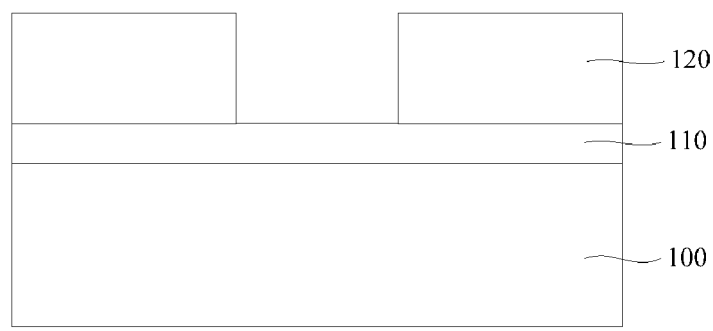
Figure 4:
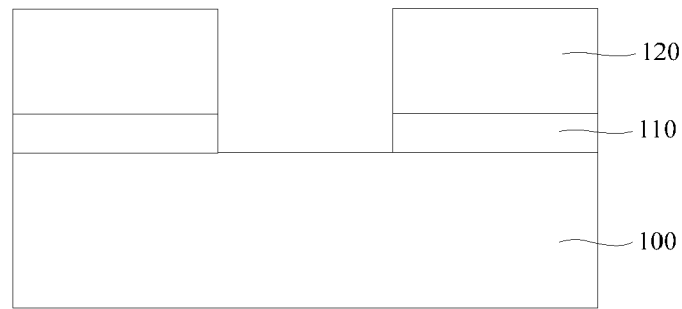

Now turning to FIG. 3, a photoresist is applied on a surface of the gate oxide layer 110 and then patterned by exposing and developing processes to form a photoresist pattern 120 which defines the position of a gate. Subsequently, as shown in FIG. 4, the exposed gate oxide layer 110 is etched by using the photoresist pattern 120 as mask, in which the preferred etching process is a wet etching process, and hydrofluoric acid (HF) is used as an etchant in this embodiment.

Figure 5:
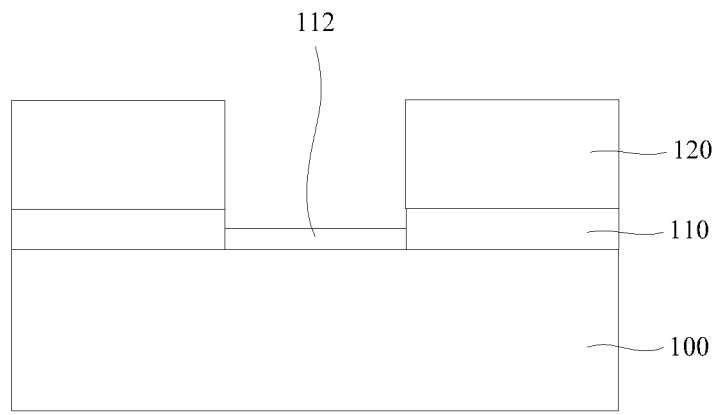
Figure 6:
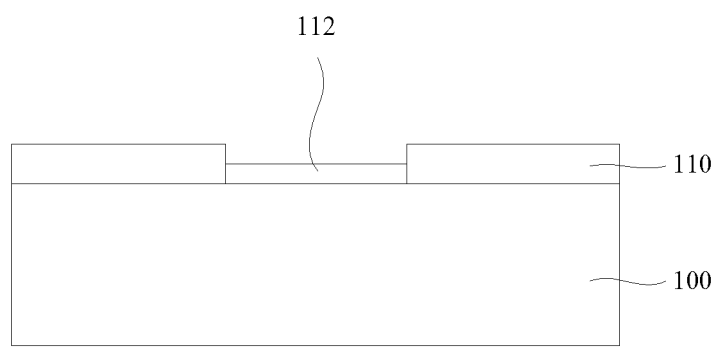
Figure 7:
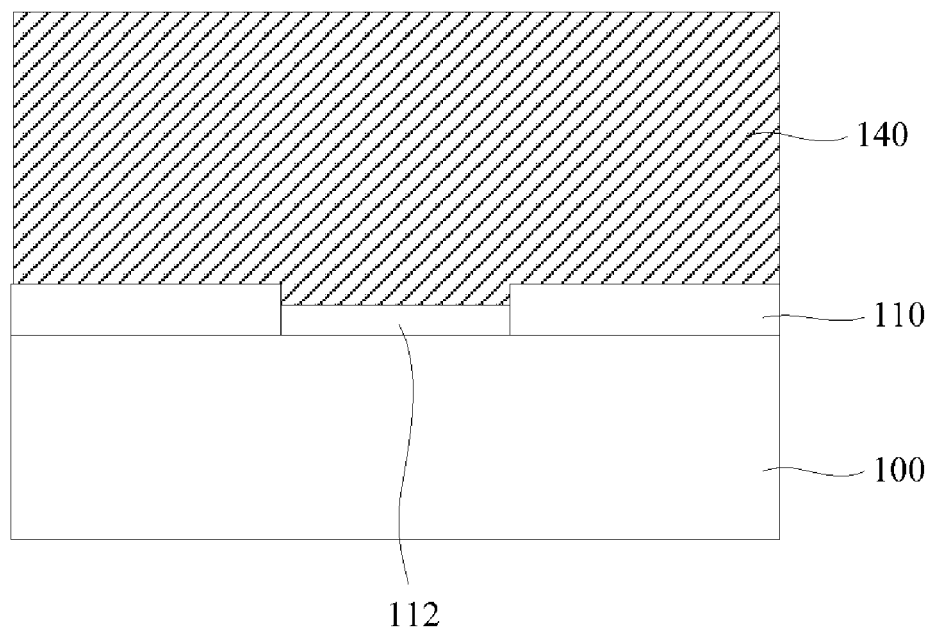

In the next step, as shown in FIG. 5, the semiconductor substrate is immersed into deionized water in a water tank, and a gate oxide layer 112 is grown again on the surface of the portion of the substrate corresponding to the gate. The thickness of the newly grown gate oxide layer 112 can be controlled by controlling the immersion time in the deionized water. In this embodiment, the newly grown gate oxide layer 112 is thinner than that of the originally grown gate oxide layer 110. Turning to FIG. 6, the photoresist pattern 120 is removed by a wet process using sulfuric acid. A polysilicon layer 140 is then deposited on the surface of the substrate by PECVD or high density plasma chemical vapor deposition (HDP-CVD), as shown in FIG. 7.

Figure 8:
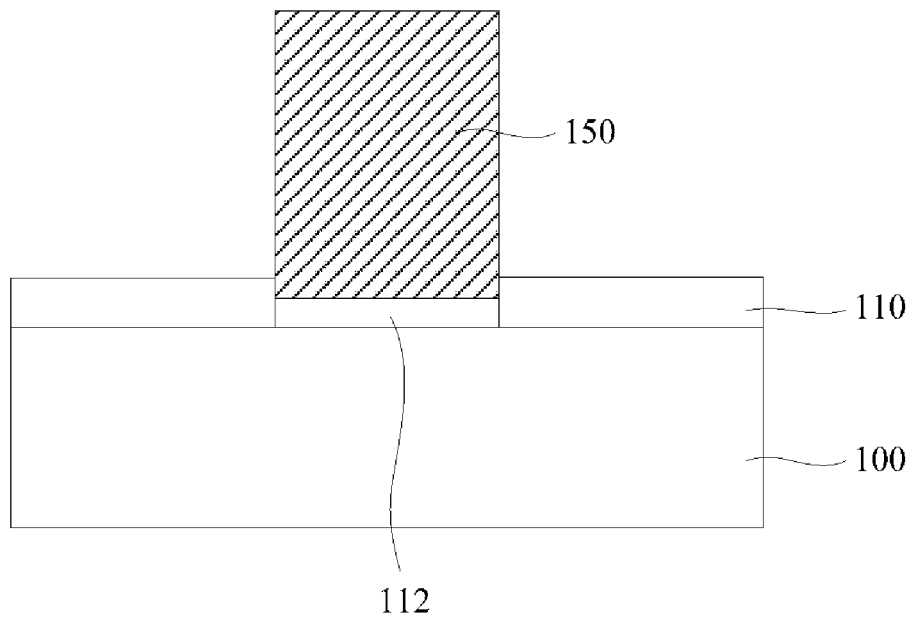

Then, the polysilicon layer 140 is etched to form a gate 150, as shown in FIG. 8.

Figure 9:
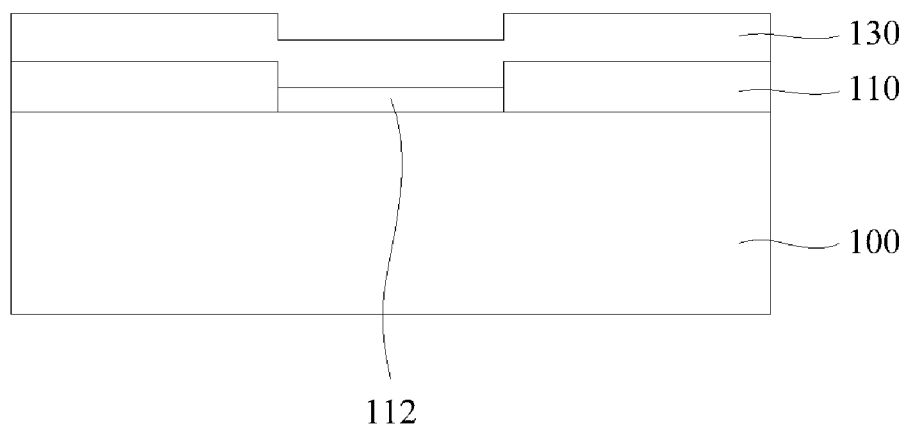
Figure 10:
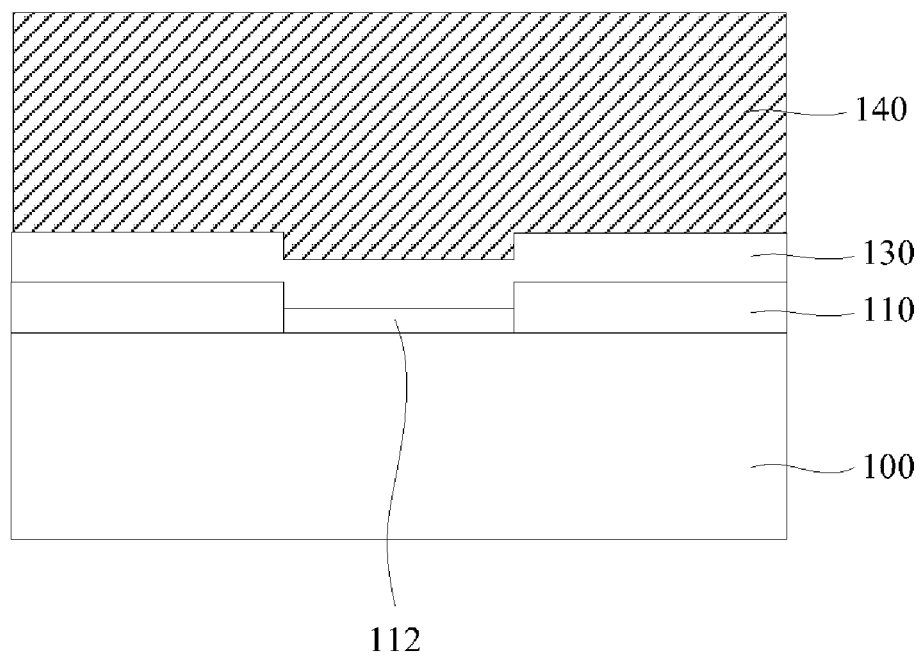
Figure 11:
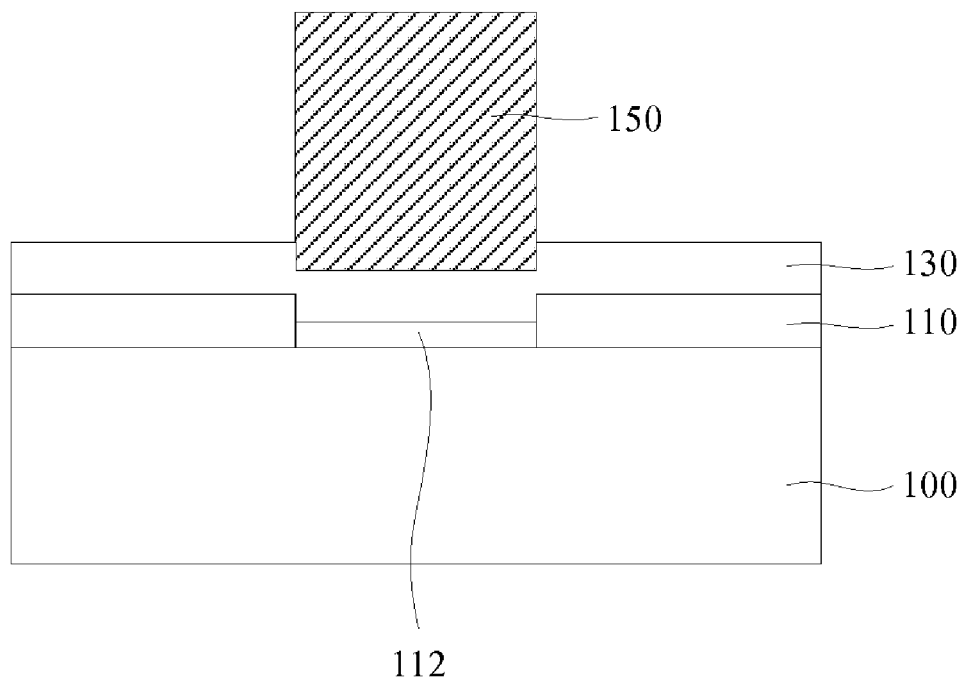

In another embodiment of the present invention, as shown in FIG. 9, an oxide layer 130 is grown on the surfaces of the gate oxide layers 110 and 112 by a thermal oxidation process again, preferably by a furnace thermal oxidation process. The oxide layer 130 actually serves to increase the overall thickness of the gate oxide layers. Then a polysilicon layer 140 is deposited on the surface of the oxide layer 130, as shown in FIG. 10. Subsequently, the polysilicon layer 140 is etched to form a gate 150, as shown in FIG. 11.

Figure 12:
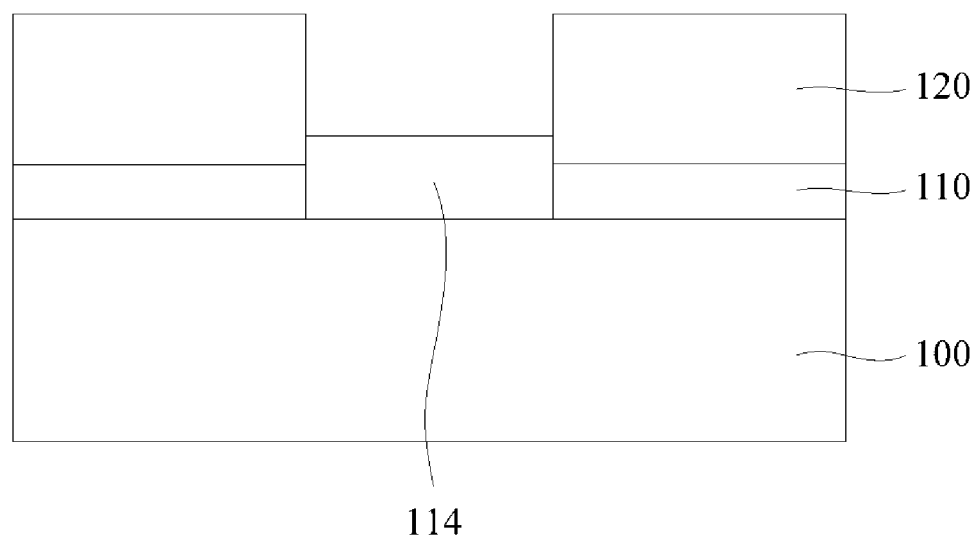
Figure 13:
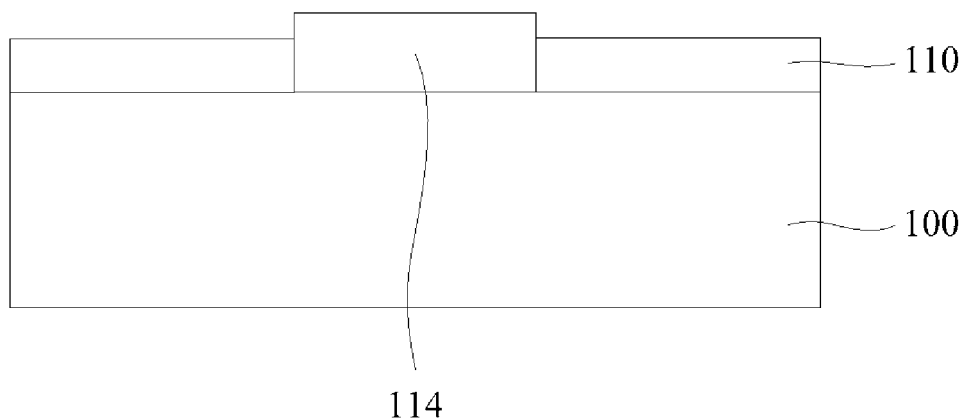
Figure 14:
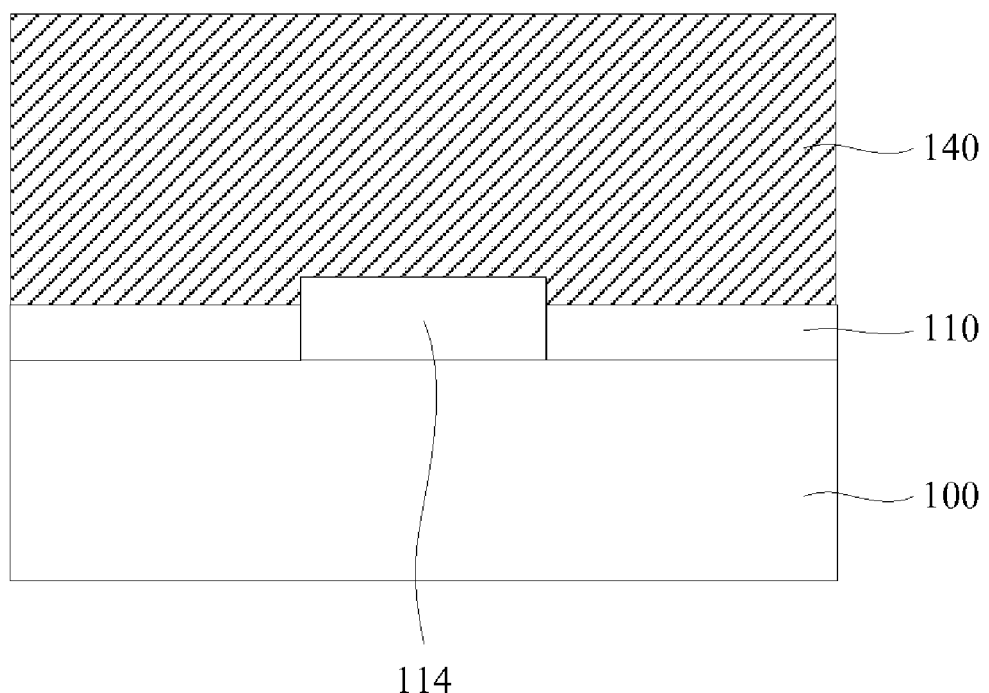
Figure 15:
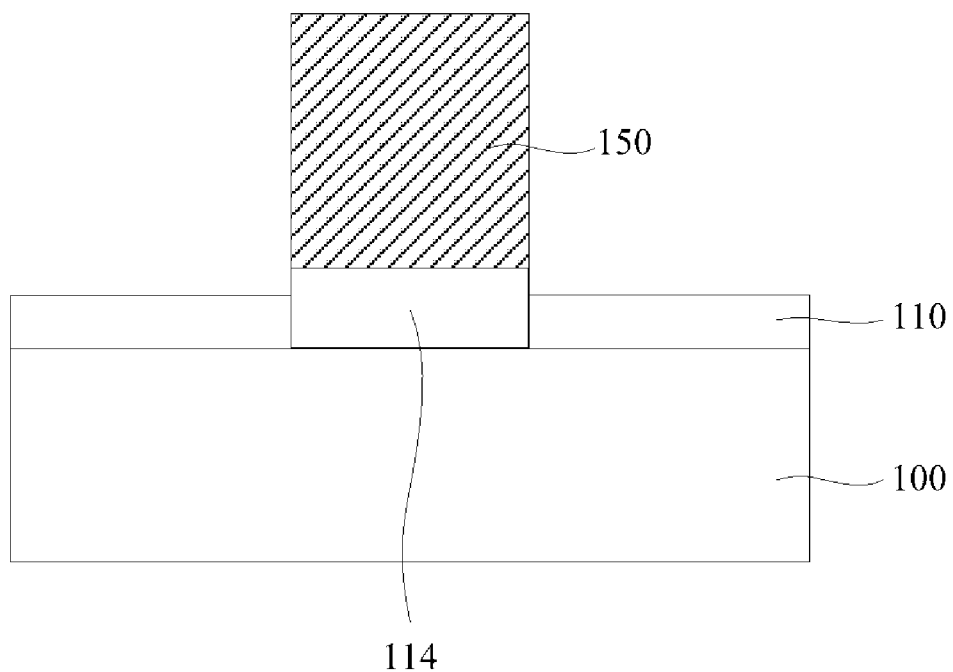

In further another embodiment of the present invention, the substrate is immersed into deionized water for a longer period of time, so that the grown gate oxide layer 114 is thicker, even thicker than the originally grown gate oxide layer 110, as shown in FIG. 12. Turning to FIG. 13, the photoresist pattern 120 is removed by a wet process using sulfuric acid. A polysilicon layer 140 is deposited on the surfaces of the gate oxide layers 110 and 114 by PECVD or high density plasma chemical vapor deposition (HDP-CVD), as shown in FIG. 14. Then the polysilicon layer 140 is etched to form a gate 150, as shown in FIG. 15.

Figure 16:
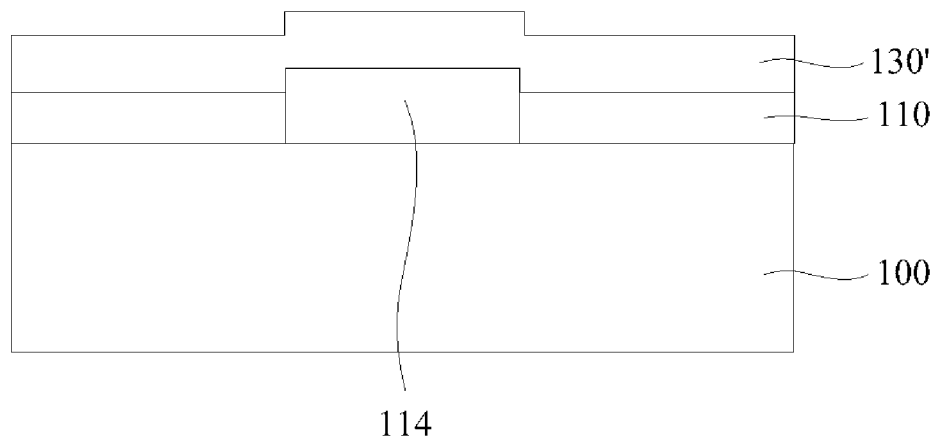
Figure 17:
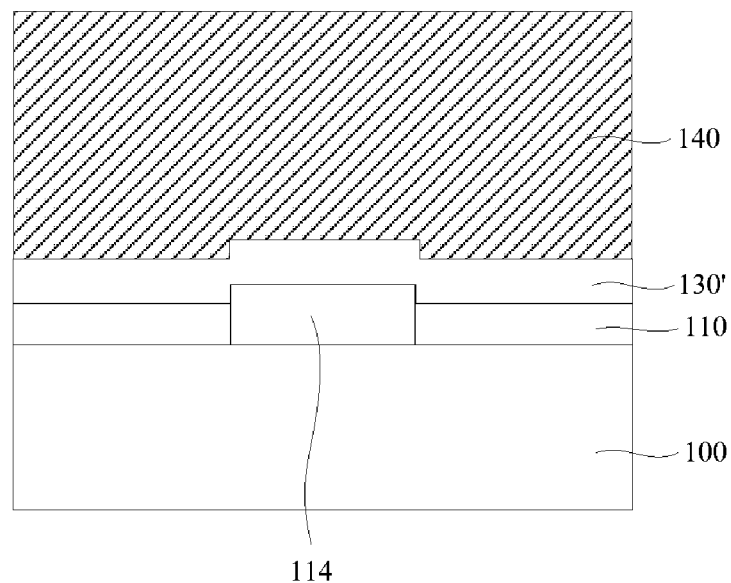
Figure 18:
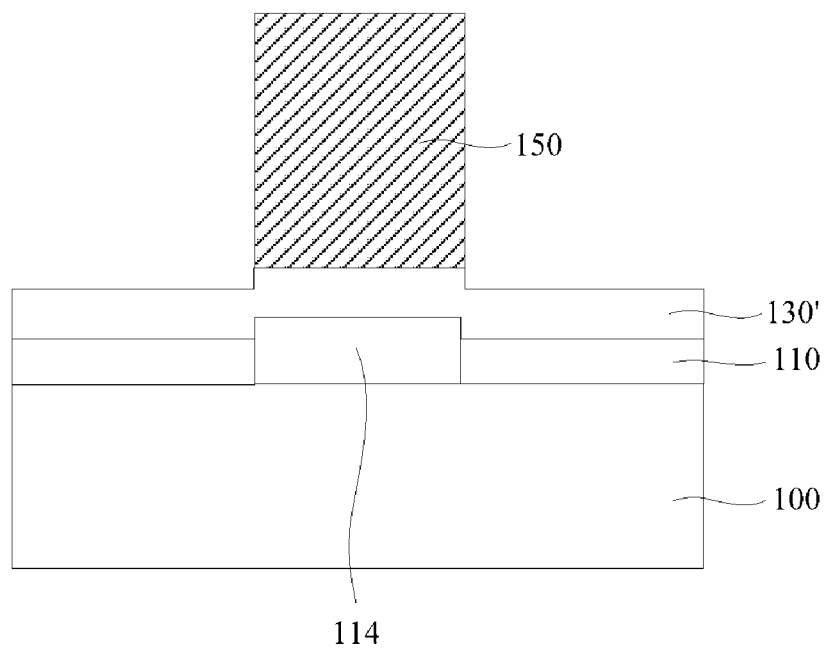

In still another embodiment of the present invention, as shown in FIG. 16, an oxide layer 130' is formed on the surfaces of the gate oxide layers 110 and 114 by a thermal oxidation process again, preferably by a furnace thermal oxidation process. The oxide layer 130' actually serves to increase the overall thickness of the gate oxide layers. Then a polysilicon layer 140 is deposited on the surface of the oxide layer 130', as shown in FIG. 17. Subsequently, the polysilicon layer 140 is etched to form a gate 150, as shown in FIG. 18.

The above embodiments are only some preferred embodiments of the present invention, but not intended to limit the present invention in any aspect. Although the present invention has been described with respect to certain preferred embodiments, it will be apparent to those skilled in the art that various changes and modifications may be made without departing from the spirit and scope of the present invention as defined in the appended claims. Accordingly, the detailed descriptions and the drawings are to be regarded as illustrative rather than restrictive. The appended claims and their equivalents are intended to cover all such modifications, changes, and other equivalents, which fall within the spirit and scope of the present invention.

What is claimed is:

1. A method for fabricating semiconductor device, which is capable of adjusting a gate oxide layer thickness, comprising:
    providing a semiconductor substrate;
    growing a first oxide layer on a surface of the semiconductor substrate;
    forming a photoresist layer on a surface of the first gate oxide layer;
    patterning the photoresist layer to form a photoresist pattern which defines the position of a gate;
    removing the exposed first oxide layer using the photoresist pattern as a mask;
    growing a second oxide layer in deionized water at the place where the first oxide layer is removed; and
    depositing a polysilicon layer and etching the polysilicon layer to form gate.

2. The method according to claim 1, wherein the first oxide layer is grown by a furnace thermal oxidation process.

3. The method according to claim 1, wherein the exposed first oxide layer is removed by using hydrofluoric acid.

4. A method for fabricating semiconductor device, which is capable of adjusting a gate oxide layer thickness, comprising:
    providing a semiconductor substrate;
    growing a first oxide layer on a surface of the semiconductor substrate;
    forming a photoresist layer on a surface of the first gate oxide layer;
    patterning the photoresist layer to form a photoresist pattern which defines the position of a gate;
    removing the exposed first oxide layer using the photoresist pattern as a mask;
    growing a second oxide layer in deionized water at the place where the first oxide layer is removed;
    forming a third oxide layer on the surfaces of the first oxide layer and the second oxide layer;
    forming a polysilicon layer on the surface of the third oxide layer; and
    etching the polysilicon layer to form gate.

5. The method according to claim 4, further comprising a step of heating the deionized water.

6. The method according to claim 4, wherein the first oxide layer is grown by a furnace thermal oxidation process.

7. The method according to claim 4, wherein the first oxide layer at the place corresponding to a gate is removed by using hydrofluoric acid.

8. The method according to claim 4, wherein the third oxide layer is formed by using the furnace thermal oxidation process or a chemical vapor deposition process.

* * * * *